(12) United States Patent
MacLellan

(10) Patent No.: US 7,401,271 B1
(45) Date of Patent: Jul. 15, 2008

(54) TESTING SYSTEM AND METHOD OF USING SAME

(75) Inventor: Christopher S. MacLellan, Walpole, MA (US)

(73) Assignee: EMC Corporation, Hopkinton, MA (US)

(*) Notice: Subject to any disclaimer, the term of this patent is extended or adjusted under 35 U.S.C. 154(b) by 290 days.

(21) Appl. No.: 09/933,468

(22) Filed: Aug. 20, 2001

(51) Int. Cl.
*G11C 29/00* (2006.01)
*G01R 31/28* (2006.01)

(52) U.S. Cl. ........................ 714/718; 714/733
(58) Field of Classification Search ................ 714/710, 714/711, 733, 718, 719
See application file for complete search history.

(56) References Cited

U.S. PATENT DOCUMENTS

| | | | | |
|---|---|---|---|---|
| 5,325,367 A * | 6/1994 | Dekker et al. | ............... | 714/718 |
| 5,355,369 A * | 10/1994 | Greenberger et al. | ....... | 714/727 |
| 5,572,712 A * | 11/1996 | Jamal | ......................... | 716/18 |
| 5,987,632 A * | 11/1999 | Irrinki et al. | ................ | 714/711 |
| 6,021,512 A * | 2/2000 | Lattimore et al. | ........... | 714/710 |
| 6,169,418 B1 * | 1/2001 | Wagner | ........................ | 326/41 |
| 6,370,661 B1 * | 4/2002 | Miner | ......................... | 714/718 |
| 6,457,141 B1 * | 9/2002 | Kim et al. | ...................... | 714/30 |
| 6,539,503 B1 * | 3/2003 | Walker | ........................ | 714/703 |
| 6,658,611 B1 * | 12/2003 | Jun | ............................. | 714/719 |
| 6,966,017 B2 * | 11/2005 | Evans | ........................ | 714/718 |

\* cited by examiner

*Primary Examiner*—Cynthia Britt
*Assistant Examiner*—John J Tabone, Jr.
(74) *Attorney, Agent, or Firm*—Krishnendu Gupta; Scott A. Ouellette

(57) ABSTRACT

A testing system (and method of using same) for testing a system-under-test (SUT) are provided. One embodiment of the testing system includes first, second, and third logic sections. The third logic section selectively couples either the first logic section or the second logic section to the SUT, based upon two control signals transmitted to the third logic section. One of the control signals is transmitted from a source external to the SUT, first logic section, second logic section, and third logic section. The other control signal is transmitted from the first logic section. When the third logic section couples the first logic section to the SUT, the first logic section may transmit one or more test-related signals to the SUT. When the third logic section couples the second logic section to the SUT, the second logic section may transmit one or more other signals to the SUT.

22 Claims, 5 Drawing Sheets

TESTING SYSTEM AND METHOD OF USING SAME

FIELD OF THE INVENTION

The present invention relates to a system (and method of using same) that may be used to test the functionality/operation of at least one system-under-test.

BACKGROUND OF THE INVENTION

Network computer systems generally include a plurality of geographically separated or distributed computer nodes that are configured to communicate with each other via, and are interconnected by, one or more network communications media. One conventional type of network computer system includes a network storage subsystem that is configured to provide a centralized location in the network at which to store, and from which to retrieve data. Advantageously, by using such a storage subsystem in the network, many of the network's data storage management and control functions may be centralized at the subsystem, instead of being distributed among the network nodes.

One type of conventional network storage subsystem, manufactured and sold by the Assignee of the subject application (hereinafter "Assignee") under the tradename Symmetrix™ (hereinafter referred to as the "Assignee's conventional storage system"), includes a plurality of disk mass storage devices configured as one or more redundant arrays of independent (or inexpensive) disks (RAID). The disk devices are controlled by disk controllers (commonly referred to as "back end" controllers/directors) that store user data in, and retrieve user data from a shared cache memory resource in the subsystem. A plurality of host controllers (commonly referred to as "front end" controllers/directors) may also store user data in and retrieve user data from the shared cache memory resource. The disk controllers are coupled to respective disk adapters that, among other things, interface the disk controllers to the disk devices. Similarly, the host controllers are coupled to respective host channel adapters that, among other things, interface the host controllers via channel input/output (I/O) ports to the network communications channels (e.g., SCSI, Enterprise Systems Connection (ESCON), and/or Fibre Channel (FC) based communications channels) that couple the storage subsystem to computer nodes in the computer network external to the subsystem (commonly termed "host" computer nodes or "hosts").

In the Assignee's conventional storage system, the shared cache memory resource may comprise a plurality of memory circuit boards that may be coupled to an electrical backplane in the storage system. The cache memory resource is a semiconductor memory, as distinguished from the disk storage devices also comprised in the Assignee's conventional storage system, and each of the memory boards comprising the cache memory resource may be populated with, among other things, relatively high-speed synchronous dynamic random access memory (SDRAM) integrated circuit (IC) devices for storing the user data. The shared cache memory resource may be segmented into a multiplicity of cache memory regions. Each of the regions may, in turn, be segmented into a plurality of memory segments. Each memory board also includes one or more application specific integrated circuit (ASIC) chips that implement certain functionalities carried out by the board (e.g., certain control logic functions).

It has been proposed to include in these ASIC chips conventional circuitry that may be used to carry out conventional methodologies for testing a system-under-test (e.g., at least one component, circuitry section, and/or logic section, hereinafter collectively or singly referred to as "SUT") embedded in the chips. More specifically, it has been proposed to include in the ASIC chips conventional boundary scan chain circuitry that may be used to test whether such SUT are operating properly.

According to this proposed arrangement, a test mode select signal is provided to the boundary scan chain circuitry associated with the SUT. The assertion state of the test mode select signal (i.e., whether the signal is asserted or unasserted) determines whether the boundary scan chain circuitry and SUT are in a test mode of operation, or are in a normal (i.e., non-test) mode of operation. During the normal mode of operation of the boundary scan chain circuitry and the SUT, data and/or control signals may propagate to, through, and from of the chip's SUT in a normal fashion. Conversely, when the boundary scan chain circuitry and SUT are in the test mode of operation, the boundary scan chain circuitry supplies to the SUT test inputs loaded into the boundary scan chain circuitry. Test outputs, generated by the SUT in response to the test inputs, may be forwarded from the boundary scan chain circuitry to test analyzer logic. The test analyzer logic may compare the test outputs with predetermined, expected values thereof (i.e., values of the test outputs that are expected if the SUT is functioning properly) to determine whether the SUT is functioning properly.

It has been discovered that, under certain conditions, it is possible for the test mode select signal to "glitch" (i.e., change erroneously) from the unasserted state to the asserted state. When this occurs, the boundary scan chain circuitry receiving the test mode select signal, and the SUT associated with the circuitry, may erroneously enter the test mode, and during this test mode, the circuitry may supply (i.e., in response to the erroneous assertion of the signal) invalid test inputs to the associated SUT. This may cause the SUT, and the ASIC comprising the SUT, to enter unknown/unanticipated operational states and may cause the behavior of the ASIC to become unpredictable. In order to be able to return the SUT and ASIC to known operational states, it may be necessary to reset, and reinitialize the ASIC to an initial valid operating state. Unfortunately, while the ASIC is being reset and re-initialized, it cannot be used to carry out data processing/data transfer related tasks in the data storage system. Accordingly, it would be desirable to provide an improved technique for testing an SUT, in which the risk that the SUT may erroneously enter the test mode, and the risk that invalid test inputs may be supplied to the SUT, may be reduced compared to the prior art.

SUMMARY OF THE INVENTION

The present invention provides a testing system and method of using same that are able to overcome the aforesaid and other disadvantages and drawbacks of the prior art. In one embodiment of the present invention, a testing system may be used to test whether an SUT is functioning properly. Both the testing system and the SUT may be comprised in an ASIC. The testing system may comprise a first logic section, a second logic section, and a third logic section. The third logic section may selectively couple either the first logic section or the second logic section to the SUT, based upon two test mode control signals transmitted to the third logic section. More specifically, in this embodiment, the third logic section may be configured to couple the first logic section to the SUT only if both of the test mode control signals are asserted, and if at least one of these two control signals is unasserted, the third logic section may couple the second logic section to the SUT.

One of the test mode control signals may be transmitted from a source that is external to the ASIC (and therefore, also is external to the SUT, first logic section, second logic section, and third logic section); the assertion state of this control signal may be selected (e.g., by a human user). The other control signal may be transmitted from the first logic section.

When the third logic section couples the first logic section to the SUT, the first logic section may transmit (e.g., during a test mode of operation of the SUT and ASIC) one or more test-related signals (e.g., predetermined test input signals) to the SUT. When the third logic section couples the second logic section to the SUT, the second logic section may transmit one or more other signals (e.g., for use during a normal mode of operation of the ASIC and SUT) to the SUT.

The SUT may be or comprise a random access memory (RAM) embedded in the ASIC. The first logic section may comprise built-in-self-test (BIST) logic. The second logic section may comprise interface logic that may interface the RAM to other logic in the ASIC and/or components/devices external to the ASIC. The third logic section may comprise controllable multiplexer logic that may be used to controllable couple either the first or the second logic section to the SUT.

When the third logic section couples the first logic section to the SUT, the first logic section may receive from the SUT one or more test outputs generated by the SUT in response to the one or more test-related signals transmitted to the SUT. The first logic section may compare the one or more test outputs to one or more expected (e.g., predetermined) test outputs in order to determine the result of the testing of the SUT (i.e., whether the SUT is functioning properly). The second logic section may also be used to store in the SUT an erroneous data value that should be detected by the BIST logic in the first logic section, during testing of the SUT, if the first logic section is functioning properly.

The first logic section may provide a test mode indication signal to the second logic section for indicating to the second logic section when the first logic section is attempting to test the SUT. The second logic section may provide to an external I/O controller (e.g., a host or disk controller external to the ASIC) an indication that testing of the SUT is underway. In response to this indication from the second logic section, the I/O controller may cause a data transfer (e.g., to or from the SUT) occurring contemporaneously with the testing of the SUT to be invalidated.

In another embodiment of the present invention, the test system may also be comprised in an ASIC, and may be used to test a multiplicity of SUT comprised in the ASIC. The test system of this variation may include a first logic section, a multiplicity of second logic sections, and a multiplicity of third logic sections. Each third logic section may be coupled to the first logic section and to a respective second logic section. Each third logic section may be configured to selectively couple either the first logic section or the respective second logic section to a respective system-under-test based upon a respective test mode control signal from the first logic section, and also based upon another test mode control signal that may be transmitted to each of the third logic sections from a source that is external to the ASIC (and therefore, is also external to the SUT, the first logic section, the second logic sections, and the third logic sections).

In this other embodiment, when the first logic section is coupled to a respective SUT via the respective third logic section, the first logic section may transmit one or more test-related signals (e.g., predetermined test input signals) to the respective SUT. Conversely, when the respective second logic section is coupled to the respective SUT via the respective third logic section, the respective second logic section may transmit one or more respective other signals (e.g., for use during a normal mode of operation of the ASIC and SUT) to the respective SUT. The first logic section may comprise programmable built-in-self-test (BIST) logic (e.g., the test input signals used by the BIST logic may be reprogrammable based upon human user input). The first logic section may be coupled to the third logic sections and to the second logic sections.

Advantageously, in the improved testing system and method of the present invention, the risk that the SUT may erroneously enter the test mode, and the risk that invalid test inputs may be supplied to the SUT, may be reduced compared to the prior art. For example, in an improved testing system made according to either of the above two embodiments of the present invention, two test mode control signals are used to control both whether the SUT is caused to enter test mode and whether test-related input signals may be supplied to the SUT. Only when both of these control signals are asserted may the SUT be caused to enter test mode and may such test-related input signals be supplied to the SUT. This provides a fail-safe mechanism that lessens the possibility that the SUT may erroneously enter the test mode, and the possibility that invalid test inputs may be supplied to the SUT.

These and other features and advantages of the present invention, and various embodiments thereof, will become apparent as the following Detailed Description proceeds and upon reference to the Figures of the drawings, wherein like numerals depict like parts, and in which:

Although the following Detailed Description will proceed with reference being made to illustrative embodiments and methods of use of the present invention, it should be understood that it is not intended that the present invention be limited to these illustrative embodiments and methods of use. On the contrary, many alternatives, modifications, and equivalents of these illustrative embodiments and methods of use will be apparent to those skilled in the art. For example, although the subject invention will be described as being used to advantage in connection with testing of a RAM embedded in an ASIC in a network data storage subsystem cache memory, the subject invention may be advantageously used to test other types of circuitry, including other types of embedded circuitry. Accordingly, the present invention should be viewed broadly as encompassing all such alternatives, modifications, and equivalents as will be apparent to those skilled in art, and should be viewed as being defined only as forth in the hereinafter appended claims.

DETAILED DESCRIPTION OF ILLUSTRATIVE EMBODIMENTS

Figure 1:
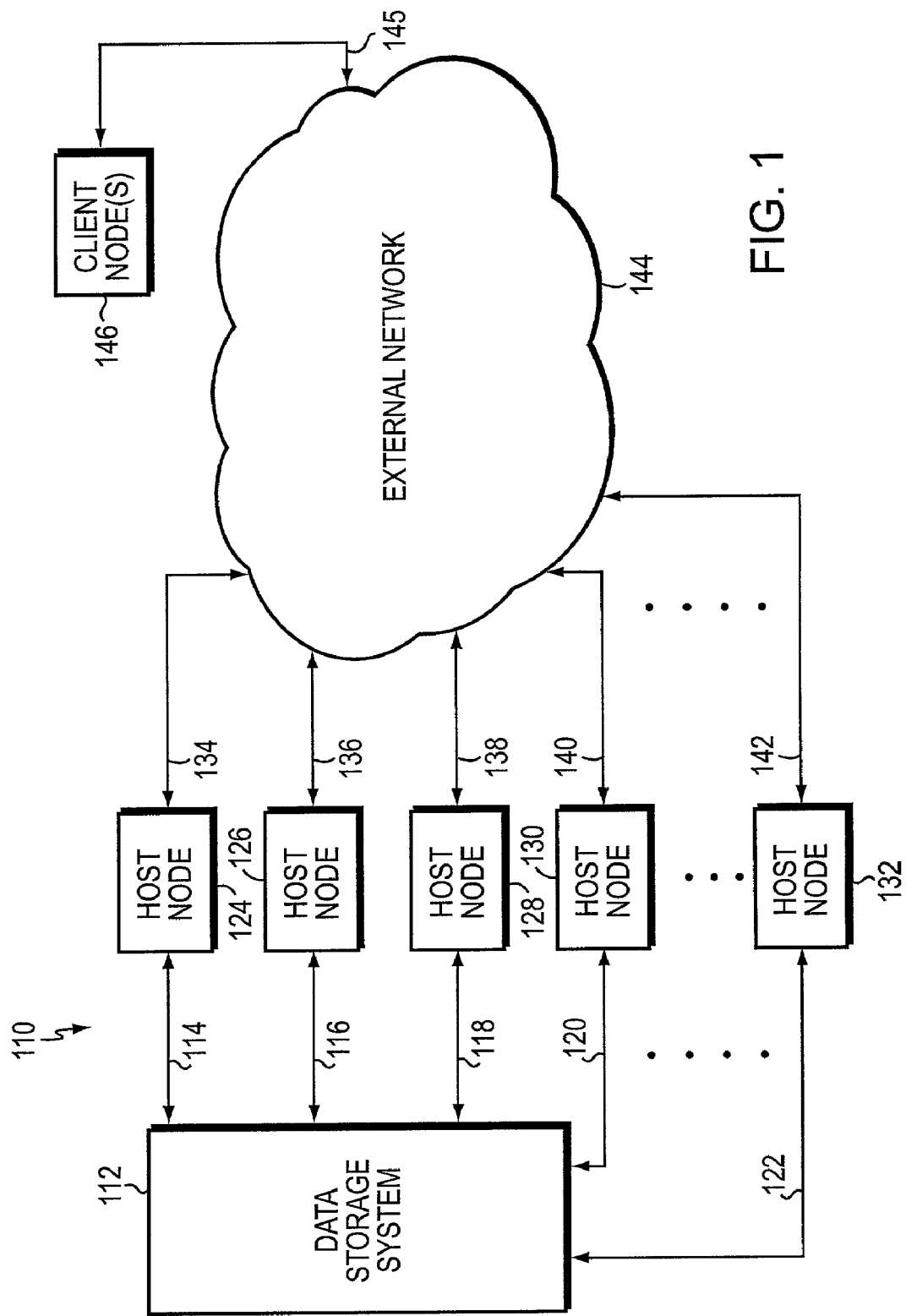
FIG. 1 is a high-level schematic block diagram of a data storage network that includes a data storage system wherein one embodiment of the present invention may be practiced to advantage.

Turning now to FIGS. 1-5, illustrative embodiments of the present invention will be described. FIG. 1 is a high-level block diagram illustrating a data storage network 110 that includes a data storage system 112 wherein one embodiment of the subject invention may be practiced to advantage. System 112 is coupled via communication links 114, 116, 118, 120, . . . 122 to respective host computer nodes 124, 126, 128, 130, . . . 132. Each of the communication links 114, 116, 118, 120, . . . 122 may be configured for communications involving a respective conventional network communication protocol (e.g., FC, ESCON, SCSI, Fibre Connectivity, etc.). Host nodes 124, 126, 128, 130, . . . 132 are also coupled via additional respective conventional network communication links 134, 136, 138, 140, . . . 142 to an external network 144. Network 144 may comprise one or more Transmission Control Protocol/Internet Protocol (TCP/IP)-based and/or Ethernet-based local area and/or wide area networks. Network 144 is also coupled to one or more client computer nodes (collectively or singly referred to by numeral 146 in FIG. 1) via network communication links (collectively referred to by numeral 145 in FIG. 1). The network communication protocol or protocols utilized by the links 134, 136, 138, 140, . . . 142, and 145 are selected so as to ensure that the nodes 124, 126, 128, 130, . . . 132 may exchange data and commands with the nodes 146 via network 144.

Host nodes 124, 126, 128, 130, . . . 132 may be any one of several well-known types of computer nodes, such as server computers, workstations, or mainframes. In general, each of the host nodes 124, 126, 128, 130, . . . 132 and client nodes 146 comprises a respective computer-readable memory (not shown) for storing software programs and data structures associated with, and for carrying out the functions and operations described herein as being carried by these nodes 124, 126, 128, 130, . . . 132, and 146. In addition, each of the nodes 124, 126, 128, 130, . . . 132, and 146 further includes one or more respective processors (not shown) and network communication devices for executing these software programs, manipulating these data structures, and for permitting and facilitating exchange of data and commands among the host nodes 124, 126, 128, 130, . . . 132 and client nodes 146 via the communication links 134, 136, 138, 140, . . . 142, network 144, and links 145. The execution of the software programs by the processors and network communication devices included in the hosts 124, 126, 128, 130, . . . 132 also permits and facilitates exchange of data and commands among the nodes 124, 126, 128, 130, . . . 132 and the system 112 via the communication links 114, 116, 118, 120, . . . 122, in the manner that will be described below.

Figure 2:
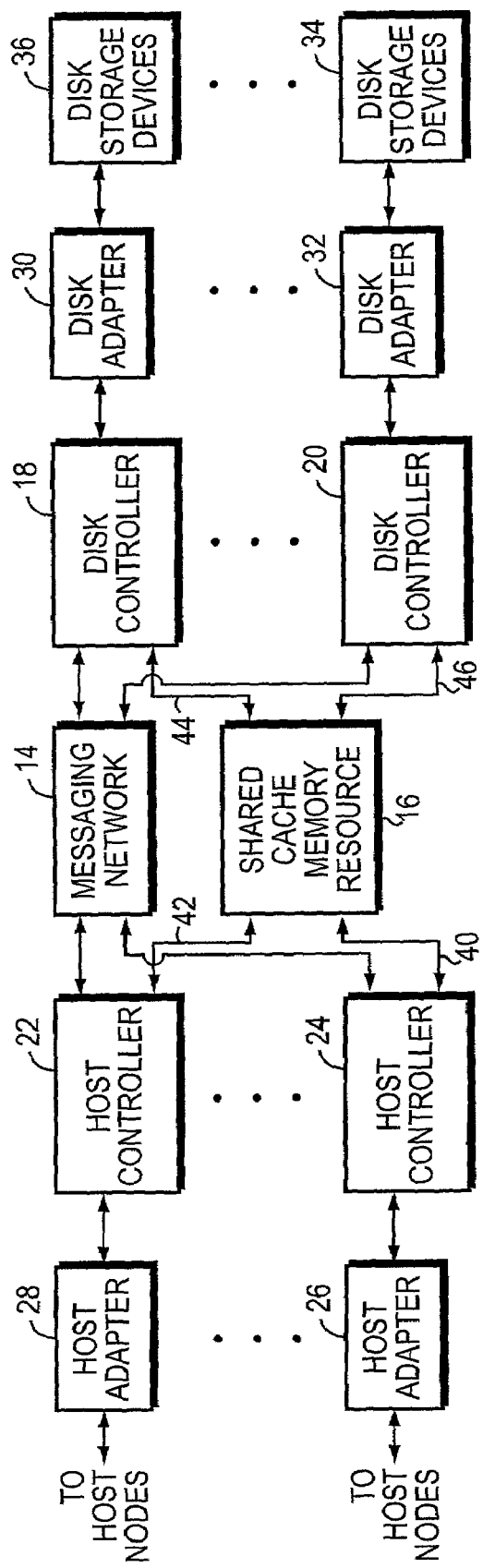
FIG. 2 is a high-level schematic block diagram illustrating functional components of the data storage system included in the data storage network shown in FIG. 1.

FIG. 2 is a high-level schematic block diagram of functional components of the system 112. System 112 includes a plurality of host adapters 26 . . . 28, a plurality of host controllers 22 . . . 24, a message network or system 14, a shared cache memory resource 16, a plurality of disk controllers 18 . . . 20, a plurality of disk adapters 30 . . . 32, and sets of disk storage devices 34 . . . 36. In system 112, the host controllers and disk controllers are coupled to individual memory boards (See FIGS. 3 and 4) comprised in the cache memory 16 via a point-to-point data transfer network system that comprises a plurality of network links. For example, host controllers 22 and 24 are coupled to the cache memory resource 16 via respective pluralities of point-to-point data transfer network links 42 and 40 comprised in the point-to-point data transfer network system. Similarly, the disk controllers 18 and 20 are coupled to the cache memory resource 16 via respective pluralities of point-to-point data transfer network links 44 and 46 comprised in the point-to-point data transfer network system.

In this embodiment of system 112, although not shown explicitly in the Figures, depending upon the particular communication protocols being used in the respective links 114, 116, 118, 120, . . . 122, each host adapter 26 . . . 28 may be coupled to multiple respective host nodes. For example, in this embodiment of system 112, if the links 114, 116, 118, 120 are FC communication links, adapter 26 may be coupled to host nodes 124, 126, 128, 130 via links 114, 116, 118, 120, respectively. It should be appreciated that the number of host nodes to which each host adapter 26 . . . 28 may be coupled may vary, depending upon the particular configurations of the host adapters 26 . . . 28, and host controllers 22 . . . 24, without departing from this embodiment of the present invention. In network 110, host adapter 26 provides network communication interfaces via which the host controller 24 may exchange data and commands, via the links 114, 116, 118, 120, with the host nodes 124, 126, 128, 130, respectively.

Each host controller 22 . . . 24 may comprise a single respective circuit board or panel. Likewise, each disk controller 18 . . . 20 may comprise a single respective circuit board or panel. Each disk adapter 30 . . . 32 may comprise a single respective circuit board or panel. Likewise, each host adapter 26 . . . 28 may comprise a single respective circuit board or panel. Each host controller 22 . . . 24 may be electrically and mechanically coupled to a respective host adapter 28 . . . 26, respectively, via a respective mating electromechanical coupling system.

Disk adapter 32 is electrically coupled to a set of mass storage devices 34, and interfaces the disk controller 20 to those devices 34 so as to permit exchange of data and commands between processors (not shown) in the disk controller 20 and the storage devices 34. Disk adapter 30 is electrically coupled to a set of mass storage devices 36, and interfaces the disk controller 18 to those devices 36 so as to permit exchange of data and commands between processors (not shown) in the disk controller 18 and the storage devices 36. The devices 34, 36 may be configured as redundant arrays of magnetic and/or optical disk mass storage devices.

It should be appreciated that the respective numbers of the respective functional components of system 112 shown in FIG. 2 are merely for illustrative purposes, and depending upon the particular application to which the system 112 is intended to be put, may vary without departing from the present invention. It may be desirable, however, to permit the system 112 to be capable of failover fault tolerance in the event of failure of a particular component in the system 112. Thus, in practical implementation of the system 112, it may be desirable that the system 112 include redundant functional components and a conventional mechanism for ensuring that the failure of any given functional component is detected and the operations of any failed functional component are assumed by a respective redundant functional component of the same type as the failed component.

The general manner in which data may be retrieved from and stored in the system 112 will now be described. Broadly speaking, in operation of network 110, a client node 146 may forward a request to retrieve data to a host node (e.g., node 124) via one of the links 145 associated with the client node 146, network 144 and the link 134 associated with the host node 124. If data being requested is not stored locally at the host node 124, but instead, is stored in the data storage system 112, the host node 124 may request the forwarding of that data from the system 112 via the FC link 114 associated with the node 124.

The request forwarded via link 114 is initially received by the host adapter 26 coupled to that link 114. The host adapter 26 associated with link 114 may then forward the request to the host controller 24 to which it is coupled. In response to the request forwarded to it, the host controller 24 may then ascertain from data storage management tables (not shown) stored in the cache 16 whether the data being requested is currently in the cache 16; if the requested data is currently not in the cache 16, the host controller 24 may forward a message, via the messaging network 14, to the disk controller (e.g., controller 18) associated with the storage devices 36 within which the requested data is stored, requesting that the disk controller 18 retrieve the requested data into the cache 16.

In response to the message forwarded from the host controller 24, the disk controller 18 may forward via the disk adapter 30 to which it is coupled appropriate commands for causing one or more of the disk devices 36 to retrieve the requested data. In response to such commands, the devices 36 may forward the requested data to the disk controller 18 via the disk adapter 30, and the disk controller 18 may transfer via one or more of the links 44 the requested data for storage in the cache 16. The disk controller 18 may then forward via the network 14 a message advising the host controller 24 that the requested data has been stored in the cache 16.

In response to the message forwarded from the disk controller 18 via the network 14, the host controller 24 may retrieve the requested data from the cache 16 via one or more of the links 40, and may forward it to the host node 124 via the adapter 26 and link 114. The host node 124 may then forward the requested data to the client node 146 that requested it via the link 134, network 144 and the link 145 associated with the client node 146.

Additionally, a client node 146 may forward a request to store data to a host node (e.g., node 124) via one of the links 145 associated with the client node 146, network 144 and the link 134 associated with the host node 124. The host node 124 may store the data locally, or alternatively, may request the storing of that data in the system 112 via the link 114 associated with the node 124.

The data storage request forwarded via link 114 is initially received by the host adapter 26 coupled to that link 114. The host adapter 26 associated with link 114 may then forward the data storage request to the host controller 24 to which it is coupled. In response to the data storage request forwarded to it, the host controller 24 may then initially transfer, via one or more of the links 40, the data associated with the request for storage in cache 16. Thereafter, one of the disk controllers (e.g., controller 18) may cause that data stored in the cache 16 to be stored in one or more of the data storage devices 36 by issuing appropriate commands for same to the devices 36 via the adapter 30.

Additional details concerning features and operation of system 112 may be found in e.g., commonly-owned, co-pending U.S. patent application Ser. No. 09/745,814 entitled, "Data Storage System Having Crossbar Switch With Multi-Staged Routing," filed Dec. 21, 2000; this co-pending application is hereby incorporated by reference herein in its entirety.

Figure 3:
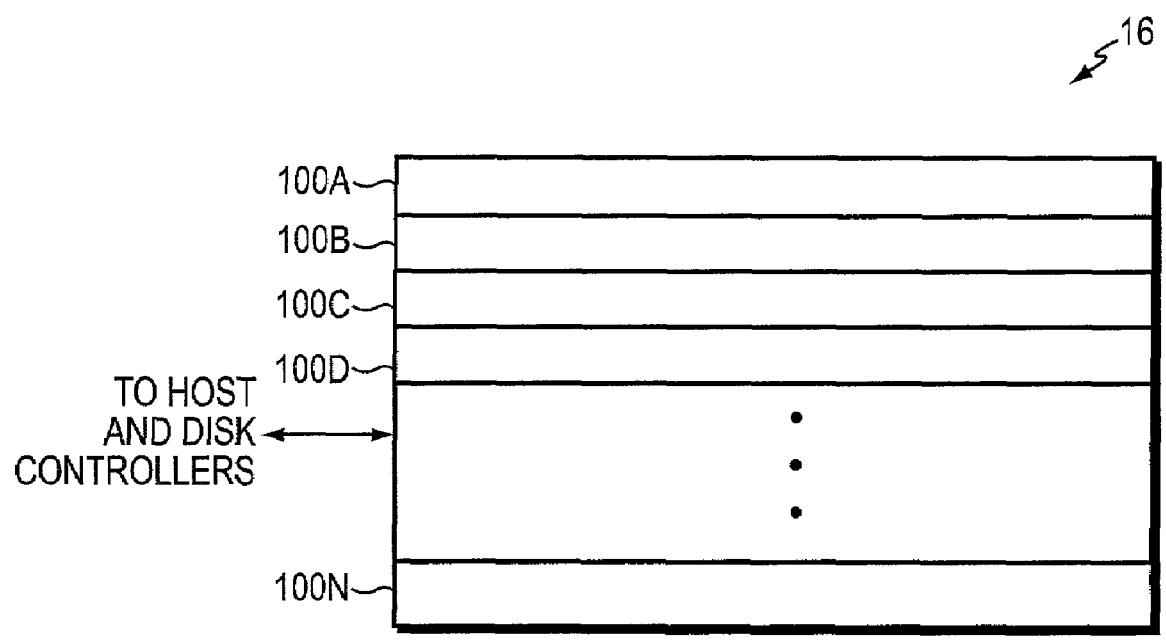
FIG. 3 is a high-level schematic block diagram illustrating functional components of the shared cache memory resource in the data storage system of FIG. 2.
Figure 4:
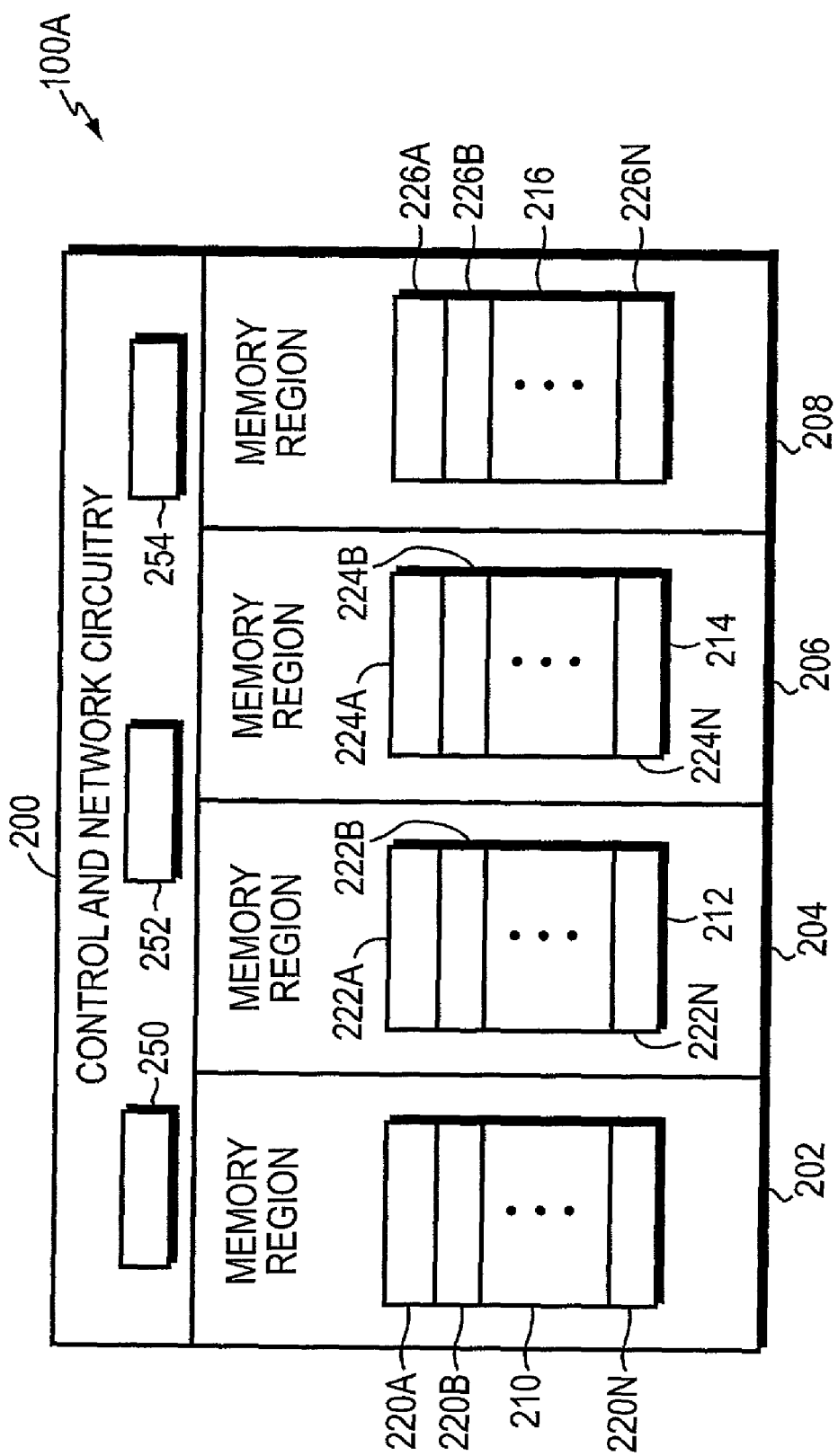
FIG. 4 is a high-level schematic block diagram illustrating functional components of a memory board that may be comprised in the shared cache memory resource of FIG. 3.
Figure 5:
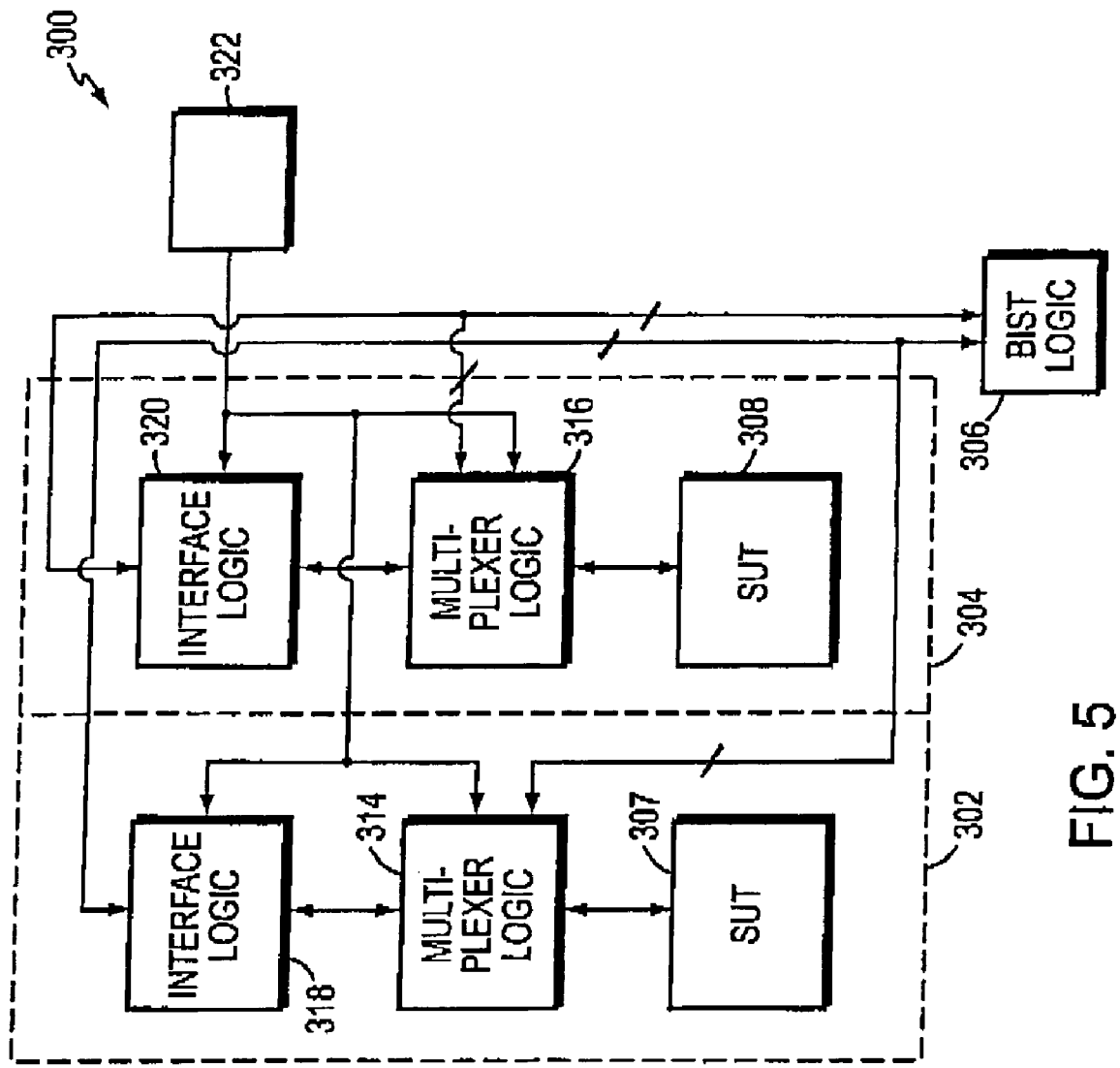
FIG. 5 is a high-level schematic block diagram illustrating functional components of a testing system made according to one embodiment of the present invention that may be used to advantage in an ASIC comprised in memory board control and network circuitry shown in FIG. 4.

With particular reference being made to FIGS. 3-5, illustrative embodiments of the present invention that may be used to advantage in the cache memory system 16 of the system 112 will now be described. Memory system 16 comprises a plurality of electrical circuit boards or cards 100A, 100B, 100C, 100D . . . 100N that may be coupled to an electrical backplane (not shown) in system 112. When coupled to this backplane, the memory boards 100A, 100B, 100C, 100D . . . 100N may become electrically connected via electrical circuit traces in the backplane to other components of system 112, such that the boards 100A, 100B, 100C, 100D . . . 100N may communicate and interact with each other and the host and disk controllers in system 112 in the manner described herein. It is important to note that the number of memory boards shown in FIG. 3 is merely illustrative, and depending upon the configuration of the system 112, the actual number of memory boards that may be comprised in the system 112 may vary. The construction and operation of each of the memory boards 100A, 100B, 100C, 100D . . . 100N are essentially identical; accordingly, in order to avoid unnecessary duplication of description, the construction and operation of one memory board 100A are described herein.

FIG. 4 is a high-level logical schematic representation of pertinent functional components of memory board 100A. Board 100A comprises control and network circuitry 200, and a plurality of memory regions 202, 204, 206, and 208. Each of the memory regions 202, 204, 206, and 208 comprises a respective plurality of banks of SDRAM IC devices. For example, region 202 comprises a plurality of banks of SDRAM IC devices (collectively referred to by numeral 210); region 204 comprises a plurality of banks of SDRAM IC devices 212; region 206 comprises a plurality of banks of SDRAM IC devices 214; and, region 208 comprises a plurality of banks of SDRAM IC devices 216. The respective pluralities of SDRAM IC devices comprised in each of the banks 210, 212, 214, and 216 are configured so as to comprise respective pluralities of memory segments of predetermined size (e.g., 256 megabytes each) in memory system 16. In this embodiment of the present invention, each of the memory segments may have a different base memory address independent of the other memory segments within the same memory region. More specifically, the SDRAM IC devices in memory banks 210 are configured so as to comprise memory segments 220A, 220B, . . . 220N; the SDRAM devices in memory banks 212 are configured so as to comprise memory segments 222A, 222B, . . . 222N; the SDRAM devices in memory banks 214 are configured so as to comprise memory segments 224A, 224B, . . . 224N; and, the SDRAM devices in memory banks 216 are configured so as to comprise memory segments 226A, 226B, . . . 226N. It should be noted that the respective number of memory regions comprised in board 100A, as well as, the numbers and sizes of the memory segments comprised in such regions may vary without departing from this embodiment of the present invention. For example, in this embodiment of the present invention, the memory regions may comprise respective integer numbers of memory segments that may vary between 2 and 64, inclusive.

In each respective memory segment, the data stored therein may be further segmented into respective pluralities of 64-bit data words. Individual data words may be grouped into stripe units of 64 words each, and the stripe units may be striped across the respective memory regions in each respective memory board.

It should be appreciated that each of the SDRAM IC devices comprised in the cache 16 is a semiconductor memory device, and these SDRAM IC devices may be used by the cache 16 to store user data forwarded to the cache 16 from the host controllers and the disk controllers in system 112, as well as, parity related data, in accordance with this embodiment of the present invention. Accordingly, the cache memory system 16 is a semiconductor memory system, as distinguished from the disk storage devices 34 . . . 36 comprised in the system 112, and the memory regions and memory segments comprised in the memory system 16 are semiconductor memory regions and semiconductor memory segments, respectively.

In general, control and network circuitry 200 comprises logic network and control logic circuitry (not shown) that may facilitate, among other things, exchange of data and commands among the memory regions 202, 204, 206, and 208 and the host controllers and disk controllers via the links 40, 42, 44, and 46. More specifically, the control logic circuitry in circuitry 200 may include memory region controllers that may control, among other things, the storing of data in and retrieval of data from the memory regions 202, 204, 206, and 208. The logic network circuitry in the circuitry 200 may include crossbar switching and associated point-to-point network circuitry (hereinafter referred to as "crossbar switching circuitry") and serial-to-parallel converter circuitry. The serial-to-parallel converter circuitry may be configured to convert serial streams of information (e.g., comprising data, address information, commands, cyclical redundancy check information, signaling semaphores, etc.) received from the host controllers and disk controllers via the links 40, 42, 44, and 46 into corresponding parallel streams of information, and to forward the parallel streams of information to the crossbar switching circuitry. The serial streams of information may also contain "tag" information indicating, among other things, the memory board in the cache 16 and the memory region in that memory board where the data is to be stored/read, the host or disk controller that initiated the data transfer associated with the data, etc. The serial-to-parallel converter circuitry may also be configured to convert parallel streams of information received from the crossbar switching circuitry to corresponding serial streams of information for forwarding to appropriate host and disk controllers via the links 40, 42, 44, and 46 associated with such appropriate controllers.

The crossbar switching circuitry may include a crossbar switch network and an associated point-to-point network. This point-to-point network may include a plurality of point-to-point interconnections or links that may couple respective ports of the crossbar switch network to respective ports of the memory region controllers. The crossbar switch network may be configured to receive the parallel information from the serial-to-parallel converter circuitry, and to forward the received information, based upon the contents of that information, via an appropriate point-to-point interconnection in the point-to-point network in board 100A to a port of an appropriate memory region controller (e.g., a memory region controller associated with a memory region in board 100A specified in the received parallel information).

Each memory region controller may issue commands, responsive to the information that it receives via the point-to-point network in board 100A, to a respective one (e.g., region 202) of the memory regions 202, 204, 206, and 208 with which it is associated. These commands may cause, among other things, the region 202 to store data in the memory banks 210, or to retrieve stored data from the memory banks 210. Such retrieved data may be forward by the memory region controller, via the point-to-point network in the board 100A to the crossbar switch network, and thence through the serial-to-parallel converter circuitry, to an appropriate host or disk controller via one of the links 40, 42, 44, and 46.

Although not shown in Figures, it should be noted that, in actual implementation of board 100A, portions of the circuitry 200 may be distributed in the regions 202, 204, 206, and 208 (e.g., circuitry for providing relatively low level commands/signals to actual SDRAM IC devices in the region, such as, chip select, clock synchronization, memory addressing, data transfer, memory control/management, clock enable signals, etc.), however, for purposes of the present discussion, this circuitry may be thought of as being logically comprised in the circuitry 200. Further details and description of the types and functions of circuitry 200 that may be distributed in the regions 202, 204, 206, and 208 in actual implementation of board 100A may be found in e.g., commonly-owned, co-pending U.S. patent application Ser. No. 09/796,259, filed Feb. 28, 2001, entitled "Error Condition Handling"; said co-pending application is hereby incorporated herein by reference in its entirety.

Portions of the respective control and network circuitry of the respective memory boards 100A, 100B, 100C, 100D . . . 100N may be embodied as application specific integrated circuits (and related circuitry) that may be preprogrammed with specific algorithms whose execution may permit the respective control and network circuitry to be able to carry out the procedures, processes, techniques, operations, and functions that are described above as being carried by such control and network circuitry. For example, for purposes of illustration, the network and control circuitry 200 in board 100A may include a respective plurality of such application specific integrated circuits 250, 252, and 254. It is important to note that the number of application specific integrated circuits shown in FIG. 4 as being comprised in circuitry 200 is merely for illustrative purposes, and may vary without departing from this embodiment of the present invention. It is also important to note that the individual respective functionality and operation of each such ASIC may vary without departing from this embodiment of the present invention.

ASIC 250 may be used to implement a portion of the functionality of the crossbar switching circuitry comprised in the circuitry 200, and may include, among other things, a testing system 300 made in accordance with one embodiment of the present invention (See FIG. 5). Testing system 300 includes a plurality of replicated groups 302 and 304 of related logic sections that are electrically coupled to an external connection mechanism 322 and to BIST logic section 306.

More specifically, group 302 includes an SUT 307 that is electrically coupled to multiplexer logic section 314, which section 314 also is electrically coupled to interface logic section 318. External connection mechanism 322 is coupled to the interface logic section 318 and to the multiplexer logic section 314. BIST logic section 306 is coupled both to logic section 314 and to logic section 318.

Group 304 includes an SUT 308 that is electrically coupled to multiplexer logic section 316, which section 316 also is electrically coupled to interface logic section 320. External connection mechanism 322 is coupled to the interface logic section 320 and to the multiplexer logic section 316. BIST logic section 306 is coupled both to logic section 316 and to logic section 320.

The respective construction and operation of interface logic section 318 in group 302 are substantially identical to the respective construction and operation of interface logic section 320 in group 304. Additionally, the respective construction and operation of multiplexer logic section 314 in group 302 are substantially identical to the respective construction and operation of multiplexer logic section 316 in group 304. Likewise, the respective construction and operation of SUT 307 in group 302 are substantially identical to the respective construction and operation of SUT 308 in group 304. Thus, as can be ascertained from the foregoing, the respective operation of each of the replicated groups 302 and 304 is substantially identical; accordingly, in order to avoid unnecessary duplication of description, the operation of one 302 of these groups 302 and 304 is described herein. It is important to note, however, that if appropriately modified in ways apparent to those skilled in the art, the respective constructions and operations of the respective SUT comprised in the groups 302 and 304 may vary without departing from the present invention.

In group 302, the SUT 307 may be or comprise a conventional static RAM device having a plurality of addressable memory locations (not shown). Data may be written to/read from these memory locations based upon signals supplied to the SUT via the static RAM's address control and data lines (hereinafter termed "the SUT's control lines"); the SUT's control lines may be coupled to respective outputs of the multiplexer logic section 314. Multiplexer logic section 314 receives, as inputs, two single-bit control signals and two respective sets of multi-bit signals. As will be described in greater detail below, these two single-bit control signals (hereinafter termed "the test mode control signals") are supplied from the external connection mechanism 322 and the BIST logic section 306, respectively, and determine whether the SUT 307 is in a test mode of operation or in a normal mode of operation. One (hereinafter termed "signal set A") of the two sets of multi-bit signals is supplied to the logic section 314 from the interface logic section 318; the other (hereinafter termed "signal set B") of the two sets of multi-bit signals is supplied to the logic section 314 from the BIST logic section 306.

The logic section 314 comprises multiplexer circuitry that is configured such that, when both of the test mode control signals are at respective logic states that signify that the test mode control signals are being asserted, the multiplexer circuitry electrically couples respective signals in the signal set B to respective SUT control lines. Conversely, the multiplexer circuitry in the logic section 314 is also configured such that, if one or more of the test mode control signals is at a respective logic state that signifies that the one or more test mode control signal is not being asserted, the multiplexer circuitry electrically couples respective signals in the signal set A to respective SUT control lines. Thus, the BIST logic section 306 is electrically coupled via the logic section 314 to the SUT 307 only when both of the test mode control signals are in respective asserted states, and conversely, when one or more of the test mode control signals is in an unasserted state, the interface logic section 318 is electrically coupled via the logic section 314 to the SUT 307.

Interface logic section 318 may be configured to interface the logic section 314 and SUT 307 to other components/devices in the ASIC 250/system 112 (e.g., host and disk controllers) such that, when the logic section 318 is electrically coupled via the logic section 314 to SUT 307 in manner described previously, these other components/devices may propagate (e.g., during a functional or normal mode of operation of the ASIC 250 and SUT 307) address control and data signals to the RAM device comprised in the SUT 307 via the interface logic 318, multiplexer logic 314, and the SUT's control lines. Mechanism 322 may comprise an external electrically conductive input pin or lead of the ASIC 250 (i.e., that is external to the internal circuitry of ASIC 250, including the logic sections comprised in the groups 302 and 304 and the logic section 306). The mechanism 322 may be electrically coupled to an external controllable switching circuit/mechanism (not shown) that may selectively couple the mechanism 322 to either a source of a low logic level signal (not shown, e.g., a ground potential terminal in system 112) or to a source of a high logic level signal (not shown, e.g., a VDD power supply terminal), depending upon the state of the switching circuit/mechanism. The respective logic levels of the respective signals supplied by these respective sources may be chosen so as to correspond to the respective logic levels associated with asserted and unasserted signals. The state of the switching circuit/mechanism may be manually selected (i.e., by manual manipulation of the switching mechanism) by a human user (not shown). Alternatively, or in addition thereto, the system 112 may comprise a computer processor (not shown) that may be external to cache memory 16, but may be coupled to, among other things, the cache memory 16. The computer processor may be programmed to provide the human user with a graphical user interface that may be used by the human user to submit commands for execution by the computer processor; the computer processor may be configured to control the state of the switching circuit/mechanism based upon these commands. By appropriately selecting the state of the switching circuit/mechanism, the human user may select whether the test mode control signal that is supplied from the mechanism 322 is in an asserted state or is in an unasserted state. Further alternatively, the computer processor may be electrically coupled to the mechanism 322, and may be configured to supply either an asserted or an unasserted test mode control signal to the mechanism 322 based upon the commands that the computer processor receives from the human user via the graphical user interface.

The computer processor may also be configured to issue a test enable command to the BIST logic section 306 based upon commands received by the computer processor from the human user via the graphical user interface. Prior to the receipt by the BIST logic section 306 of the test enable command from the computer processor, the BIST logic section 306 may operate in a normal mode of operation in which the circuitry comprised in the BIST logic section 306 may maintain in an unasserted state the test mode control signal supplied from the BIST logic section 306 to the logic section 314. Conversely, however, when the BIST logic section 306 receives the test enable command from the computer processor, the BIST logic section 306 may enter a test mode of operation in which the circuitry comprised in the BIST logic section 306 may cause to become asserted the test mode control signal supplied from the logic section 306 to the logic section 314.

It is important to note that the BIST logic section 306 may be configured to supply separate respective test mode control signals to the respective multiplexer logic sections 314 and 316 comprised in the groups 302 and 304, respectively, based upon different test enable commands supplied to the logic section 306 from the computer processor. That is, the human user may be able to specify to the computer processor via the graphical user interface which of the SUT 307 and 308 the human user desires to undergo BIST testing, and in response to such specifications from the human user, the computer processor may issue an appropriate command to the BIST logic 306 that may cause the BIST logic 306 to enter its test mode of operation, and when in the test mode of operation, to assert only test mode control signal(s) from BIST logic 306 to the multiplexer logic section(s) associated with the SUT that the human user has specified are to undergo such testing, and to test only the user-specified SUT. For example, if the human user specifies that only the SUT 307 is to be tested, the test enable command issued to the BIST logic 306 may so indicate, and in response to the command, the BIST logic section 306 may assert only the test mode control signal that is being supplied from the BIST logic section 306 to the logic section 314, and the BIST logic section 306 may test only the user-specified SUT 307; the BIST logic 306, in this example, does not assert the test mode control signal that is being supplied from the BIST logic 306 to the logic section 316, and the BIST logic 306 does not test the SUT 308.

In operation of the system 300, when it is desired for the SUT 307 to undergo BIST testing, the human user may cause the test mode control signal supplied from the mechanism 322 to become asserted, and also may cause the BIST logic section 306 to enter its test mode of operation (e.g., by submitting appropriate commands to the computer processor, as described above). As stated above, when the logic section 306 is in its test mode of operation and the test enable command issued to BIST logic 306 specifies that the SUT 307 is to be tested, the logic section 306 asserts the test mode control signal that is supplied from the logic section 306 to the multiplexer logic 314. Thus, both of the test mode control signals that are being supplied to the logic section 314 become asserted. As discussed above, this causes the multiplexer logic section 314 to couple the signal set B from the logic section 306 to respective SUT control lines of SUT 307, thereby causing the SUT 307 to enter its test mode of operation.

When the BIST logic section 306 asserts the test mode control signal that is being supplied from the section 306 to the logic section 314, the section 306 may also provide to the interface logic section 318 an indication signal that indicates to the section 318 that the BIST logic section 306 is attempting to test the SUT 307. In response to receipt of this indication signal by the section 318, the section 318 may sense the assertion state of the test mode control signal that is being supplied from the mechanism 322 to the logic section 314; if the section 318 senses that this test mode control signal is being asserted, the section 318 may supply to one or more of the host and disk controllers signals that may provide an indication to the one or more host and disk controllers that testing of the SUT is occurring. If a data transfer operation involving the logic section 318 and the SUT 307 (i.e., a transfer of data to the SUT 307 from the logic section 318, or a transfer of data from the SUT 307 to the logic section 318) contemporaneously is in progress when a host or disk controller receives the indication from the logic section 318, the host or disk controller may invalidate the data transfer operation. After BIST logic 306 has completed testing of the SUT 307, the BIST logic 306 may indicate same to the logic section 318. The logic section 318 may then indicate the completion of testing of the SUT 307 to one or more of the host and disk controllers, and the data transfer operation that was invalid may be retried.

When the multiplexer logic section 314 couples the signal set B from the logic section 306 to respective SUT control lines of SUT 307, the BIST logic 306 tests whether the SUT 307 is operating properly by applying predetermined test input signals to the SUT control lines that cause predetermined patterns of data values to be written into each respective addressable memory location in the SUT 307. These patterns of data values may comprise test patterns used in conventional memory testing algorithms, such as conventional "checkerboard" and/or "march" test patterns. The BIST logic 306 may be re-programmed (e.g., via download of instructions from the computer processor) to cause other types of predetermined test patterns to be written to the SUT 307. The BIST logic 306 may apply signals to the SUT control lines that may cause the respective data values stored in the respective memory locations to be read, and the BIST logic 306 may compare (i.e., as test outputs) the data values read from the SUT 307 to respective, expected data values (i.e., respective predetermined data values that are expected to be read from the respective memory locations in the SUT 307 if the SUT 307 is functioning properly). If the data values read from the SUT 307 do not match these expected data values, the BIST logic 306 may determine that the SUT 307 is not functioning properly; conversely, if the data values read from the SUT 307 match these expected data values, the BIST logic 306 may determine that the SUT 307 is functioning properly. In either case, the BIST logic 306 may report the results of the testing of the SUT 307 (i.e., whether the BIST logic section 306 has determined that the SUT 307 is or is not functioning properly) to the computer processor; the computer processor may then report these results to the human user via the graphical user interface.

The computer processor may also be configured to test whether the BIST logic 306 is functioning properly. More specifically, when the BIST 306 is in test mode, the computer processor may command the BIST logic 306 to temporarily suspend testing of the SUT 307 (i.e., temporarily suspend application of the predetermined test input signals to the SUT 307). While the testing of the SUT 307 by the BIST logic 306 is temporarily suspended, the computer processor may cause either or both of the test mode control signals to be de-asserted temporarily, and may cause the interface logic 318 to supply to the SUT control lines via the signal set A appropriate signals that that may cause a data value previously written into a memory location in the SUT 307 by the BIST logic 306 (e.g., written to the memory location immediately prior to the suspension of the testing of the SUT 307) to be overwritten by an erroneous value (i.e., a value that does not match the predetermined data value that the BIST logic 306 expects to read from the memory location when the testing of the SUT 307 by the BIST logic 306 resumes). Thereafter, the computer processor may cause both of the test mode control signals to be re-asserted, and may command the BIST logic 306 to resume testing of the SUT 306, starting from the point in the BIST logic's testing routing at which the testing was suspended. After the BIST logic 306 resumes testing of the SUT 307, the BIST logic 306 may read the erroneous value from the memory location in the SUT 307, and may compare the erroneous value thus read with the predetermined value that the BIST logic 306 expects to read from that memory location. Given that these two values do not match, if the BIST logic 306 is functioning properly, after the BIST logic 306 makes this comparison, the BIST logic 306 should report to the computer processor that the SUT 307 is not functioning properly. Thus, if, after the BIST logic 306 makes this comparison, the BIST logic 306 does not report to the computer processor that the SUT 307 is not functioning properly, the computer processor may determine that the BIST logic 306 itself is not functioning properly, and may report same to the human user.

The computer processor may include a computer-readable memory that may store software programs and data structures associated with, and for carrying out the inventive and other functions, methods, techniques, and operations described herein as being carried out by the computer processor. The computer processor may be configured to execute these software programs and manipulate these data structures. The execution of the software programs by the computer processor may cause and facilitate the inventive and other functions, methods, techniques, and operations described herein as being carried out by the computer processor. It will be apparent to those skilled in the art that many types of processors and memories may be used according to the teachings of the present invention to implement the present invention.

The number of replicated groups of related logic sections 302 and 304 shown in FIG. 5 as being comprised in the testing system 300 is merely for illustrative purposes, and said number may vary without departing from the present invention. Thus, for example, although the testing system 300 shown in FIG. 5 comprises a plurality of such groups 302 and 304, a testing system made according to another embodiment of the present invention may comprise only a single such group (e.g., group 302).

Thus, it is evident that there has been provided, in accordance with the present invention, a testing system and method of using same that fully satisfy the aims and objectives, and achieve the advantages, hereinbefore set forth. The terms and expressions which have been employed in this application are used as terms of description and not of limitation, and there is no intention, in the use of such terms and expressions, of excluding any equivalents of the features shown and described or portions thereof, but it is recognized that various modifications are possible within the scope of the invention as claimed.

For example, although illustrative embodiments of the present invention have been described in connection with use in a network data storage system that comprises a messaging network 14 that facilitates communications between the host controllers and the disk controllers, and a point-to-point data transfer network system that comprises links 40, 42, 44, and 46, if appropriately modified, these embodiments of the present invention may instead be used in connection with other types of network data storage systems, e.g., that utilize a redundant bus system of the type described in commonly-owned, co-pending U.S. patent application Ser. No. 09/796, 259, filed Feb. 28, 2001, entitled "Error Condition Handling".

Other modifications are also possible. Accordingly, the present invention should be viewed broadly as encompassing all modifications, variations, alternatives and equivalents as may be encompassed by the hereinafter appended claims.

What is claimed is:

1. Testing system for use in testing a system-under-test (SUT), the testing system comprising:
   a first logic section that transmits one or more test-related signals for use during a test mode of the SUT;
   a second logic section that transmits one or more other signals during a normal operating mode of the SUT; and
   a third logic section that selectively couples the first logic section or the second logic section to the SUT based upon respective states of two control signals, one of the two control signals being transmitted to the third logic section from a source that is external to the SUT, the first logic section, the second logic section, and the third logic section, the other of the two control signals being transmitted to the third logic section from the first logic section;
   wherein:
      when the third logic section couples the first logic section to the SUT, the first logic section transmits the one or more test-related signals to the SUT, and when the third logic section couples the second logic section to the SUT, the second logic section transmits the one or more other signals to the SUT;
   wherein the first logic section comprises built-in-self-test (BIST) logic and the one or more test-related signals comprise test input signals for use in testing the SUT.

2. The resting system of claim 1, wherein the first logic section provides an indication signal to the second logic section for indicating when the first logic section is attempting to test the SUT.

3. The testing system of claim 2, wherein the second logic section provides to an input/output (I/O) controller an indication that the testing of the SUT is occurring, the I/O controller being external to the first logic section, the second logic section, the third logic section, and the SUT.

4. The testing system of claim 3, wherein, in response to the indication from the second logic section, the I/O controller causes a data transfer occurring contemporaneously with the testing of the SUT to be invalidated.

5. The testing system of claim 1, wherein the respective state of the one of the two control signals is selected.

6. The testing system of claim 1, wherein:
   when the third logic section couples the first logic section to the SUT, the first logic section receives one or more test outputs from the SUT, the one or more test output signals being generated by the SUT in response to the one or more test-related signals, and the first logic section compares the one or more rest outputs to one or more expected test outputs whereby to determine results of the testing.

7. The testing system of claim 1, wherein:
   if both of the control signals are asserted, the third logic section couples the first logic section to the SUT;
   if at least one of the control signals is unasserted, the third logic section couples the second logic section to the SUT.

8. The testing system of claim 1, wherein:
   the SUT comprises a memory; and
   the second logic section transmits an erroneous value to be stored in the memory that is detected during a second test mode of the system.

9. Testing system for use in testing a plurality of systems-under-test, the testing system comprising:
   a first logic section comprising programmable built-in-self-test logic;
   a plurality of second logic sections;
   a plurality of third logic sections;
   each respective third logic section being coupled to the first logic section and to a respective second logic section, and being configured to selectively couple the first logic section or the respective second logic section to a respective system-under-test based upon a respective control signal from the first logic section and also based upon another control signal, the another control signal being transmitted to each third logic section from a source that is external to the plurality of systems-under-test, the first logic section, the plurality of second logic sections, and the plurality of third logic sections;
   wherein:
      when the first logic section is coupled to the respective SUT, the first logic section transmits one or more test-related signals to the respective SUT, and when the respective second logic section is coupled to the respective SUT, the respective second logic section transmits one or more respective other signals to the respective SUT.

10. The testing system of claim 9, wherein the testing system is comprised in an application specific integrated circuit (ASIC), and the source is external to the ASIC.

11. The testing system of claim 10, wherein:
   the first logic section is coupled to each of the third logic sections and to each of the second logic sections.

12. Method of using a testing system for testing a system-under-test (SUT), the testing system including a first logic section, a second logic section, and a third logic section, the method comprising:
   selectively coupling, via the third logic section, the first logic section or the second logic section to the SUT based upon respective states of two control signals, one of the two control signals being transmitted to the third logic section from a source that is external to the SUT, the first logic section, the second logic section, and the third logic section, the other of the two control signals being transmitted to the third logic section from the first logic section;

transmitting to the SUT from the first logic section, when the first logic section is coupled to the SUT via the third logic section, one or more test-related signals; and transmitting to the SUT from the second logic section, when the second logic section is coupled to the SUT via the third logic section, one or more other signals to the SUT;

wherein the first logic section comprises built-in-self-test (BIST) logic and the one or more test-related signals comprise test input signals for use in testing the SUT.

13. The method of claim 12, further comprising, providing from the first logic section an indication signal to the second logic section for indicating when the first logic section is attempting to test the SUT.

14. The method of claim 13, further comprising, providing from the second logic section an indication to an input/output (I/O) controller that the testing of the SUT is occurring, the I/O controller being external to the first logic section, the second logic section, the third logic section, and the SUT.

15. The method of claim 14, wherein, in response to the indication from the second logic section, the I/O controller causes a data transfer occurring contemporaneously with the testing of the SUT to be invalidated.

16. The method of claim 12, wherein the respective state of the one of the two control signals is selected.

17. The method of claim 12, further comprising:

receiving at the first logic section, when the third logic section couples the first logic section to the SUT, one or more test outputs from the SUT, the one or more test outputs being generated by the SUT in response to the one or more test-related signals; and comparing at the first logic section the one or more test outputs to one or more expected test output signals.

18. The method of claim 12, wherein:

if both of the control signals are asserted, the first logic section is coupled via the third logic section to the SUT; and if at least one of the control signals is unasserted, the second logic section is coupled via the third logic section to the SUT.

19. The method of claim 12, wherein:

the SUT comprises a memory; and the method further comprises transmitting an erroneous value to be stored in the memory that is detected by the first logic section during a second test mode of the system.

20. Method of using a testing system to test a plurality of systems-under-test, the testing system including a first logic section comprising programmable built-in-self-test logic, a plurality of second logic sections, and a plurality of third logic sections, each respective third logic section being coupled to the first logic section and to a respective second logic section, the method comprising:

configuring each respective third logic section to selectively couple the first logic section or the respective second logic section to a respective system-under-test based upon a respective control signal from the first logic section and also based upon another control signal, the another control signal being transmitted to each third logic section from a source that is external to the plurality of systems-under-test, the first logic section, the plurality of second logic sections, and the plurality of third logic sections;

transmitting from the first logic section, when the first logic section is coupled to the respective SUT, one or more test-related signals to the respective SUT; and transmitting from the respective second logic section, when the respective second logic section is coupled to the respective SUT, one or more respective other signals to the respective SUT.

21. The method of claim 20, wherein the testing system is comprised in an application specific integrated circuit (ASIC), and the source is external to the ASIC.

22. The method of claim 21, wherein:

the first logic section is coupled to each of the third logic sections and to each of the second logic sections.

* * * * *